(12) United States Patent
Shim et al.

(10) Patent No.: US 6,627,990 B1
(45) Date of Patent: Sep. 30, 2003

(54) THERMALLY ENHANCED STACKED DIE PACKAGE

(75) Inventors: Il Kwon Shim, Singapore (SG); Kambhampati Ramakrishna, Chandler, AZ (US); Seng Gaun Chow, Singapore (SG)

(73) Assignee: St. Assembly Test Service Ltd., Singapore (SG)

( * ) Notice: Subject to any disclaimer, the term of this patent is extended or adjusted under 35 U.S.C. 154(b) by 0 days.

(21) Appl. No.: 10/359,407

(22) Filed: Feb. 6, 2003

(51) Int. Cl.[7] .............................................. H01L 23/34
(52) U.S. Cl. ....................................... 257/712; 257/723
(58) Field of Search ............................... 257/712, 723, 257/796, 787, 666, 676

(56) References Cited

U.S. PATENT DOCUMENTS

| | | | | |
|---|---|---|---|---|
| 5,814,881 A | * | 9/1998 | Alagaratnam et al. ...... | 257/686 |
| 6,080,264 A | * | 6/2000 | Ball ............................ | 156/292 |
| 6,087,718 A | * | 7/2000 | Cho ............................ | 257/686 |
| 6,087,722 A | * | 7/2000 | Lee et al. .................... | 257/723 |
| 6,118,176 A | * | 9/2000 | Tao et al. .................... | 257/676 |
| 6,261,865 B1 | * | 7/2001 | Akram ........................ | 438/111 |
| 6,297,547 B1 | * | 10/2001 | Akram ........................ | 257/676 |
| 6,307,257 B1 | * | 10/2001 | Huang et al. ............... | 257/676 |
| 6,337,521 B1 | * | 1/2002 | Masada ...................... | 257/777 |

\* cited by examiner

Primary Examiner—Roy Potter
(74) Attorney, Agent, or Firm—George O. Saile; Stephen B. Ackerman; Stephen G. Stanton

(57) ABSTRACT

A stacked die design, and a method of forming the same, comprising: a substrate having a lower surface and an upper surface; a lower die connected to the substrate; a thermally conductive metal interposer thermally connected to the lower die and/or the substrate; and an upper die thermally connected to the metal interposer. The lower die and the upper die being spaced apart and comprising a stacked die whereby any heat generated by the upper die is transferred to the substrate by the metal interposer.

56 Claims, 5 Drawing Sheets

THERMALLY ENHANCED STACKED DIE PACKAGE

FIELD OF THE INVENTION

The present invention relates generally to electronic packaging and specifically to stacked die/chip packages.

BACKGROUND OF THE INVENTION

Current practice involves using solid element spacers between stacked dies/chips. Such spacers are typically comprised of organic adhesive alone or in combination with ceramic/silicon. However, the top die/chip has been found to have thermal issues. The solid element spacers cannot be comprised of electrically conductive material and such solid element spacers generally have low thermal conductivity.

U.S. Pat. No. 6,261,865 B1 to Akram describes a multichip semiconductor package using a lead-on-chip lead frame and method of construction.

U.S. Pat. No. 6,087,722 to Lee et al. describes a multichip package that does not include a die pad.

U.S. Pat. No. 6,118,176 to Tao et al. describes a stacked chip assembly generally includes a first chip, a second chip and a lead frame.

U.S. Pat. No. 6,297,547 B1 to Akram describes a multiple die package in which a first and second die are mounted on a leadframe.

U.S. Pat. No. 5,814,881 to Alagaratnam et al. describes a stacked integrated chip package and method of making same.

U.S. Pat. No. Re. 36,613 to Ball describes a multiple stacked die device that contains up to four dies and permits close-tolerance stacking by a low-loop-profile wire-bonding operation and a thin-adhesive layer between the stacked dies.

U.S. Pat. No. 6,080,264 to Ball describes an apparatus and method for increasing integrated circuit density comprising utilizing chips with both direct (flip chip type) chip to conductors connection technology and wire bonds and/or tape automated bonding (TAB).

U.S. Pat. No. 6,087,718 to Cho describes a stacked-type semiconductor chip package of a lead-on chip structure which is modified for stacking chips in the package.

U.S. Pat. No. 6,307,257 B1 to Huang et al. describes a dual-chip integrated circuit (IC) package with a chip-die pad formed form leadframe leads.

U.S. Pat. No. 6,337,521 B1 to Masuda describes a semiconductor device and a method of manufacturing the same. The device comprising two semiconductor chips stacked on each other with their backs opposite to each other and sealed with a mold resin.

SUMMARY OF THE INVENTION

Accordingly, it is an object of one or more embodiments of the present invention to provide thermally enhanced stacked die/chip package designs.

Another object of one or more embodiments of the present invention to provide stacked die/chip package designs having reduced die attach interface area to reduce stress and moisture sensitivity.

Other objects will appear hereinafter.

It has now been discovered that the above and other objects of the present invention may be accomplished in the following manner. Specifically, a stacked die design, and a method of forming the same, comprising: a substrate having a lower surface and an upper surface; a lower die connected to the substrate; a thermally conductive metal interposer thermally connected to the substrate; and an upper die thermally connected to the metal interposer. The lower die and the upper die being spaced apart and comprising a stacked die whereby any heat generated by the upper die is transferred to the substrate by the metal interposer.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which:

FIGS. 8 to 9 schematically illustrate a fourth preferred electrically grounded metal interposer with support columns embodiment of the present invention having a metal interposer below the lower die/chip with: FIG. 8 being a cross-sectional electrically isolated metal interposer view of the top down plan view FIG. 9 taken along line 8—8.

DETAILED DESCRIPTION OF THE PREFERRED EMBODIMENT

Figure 1:
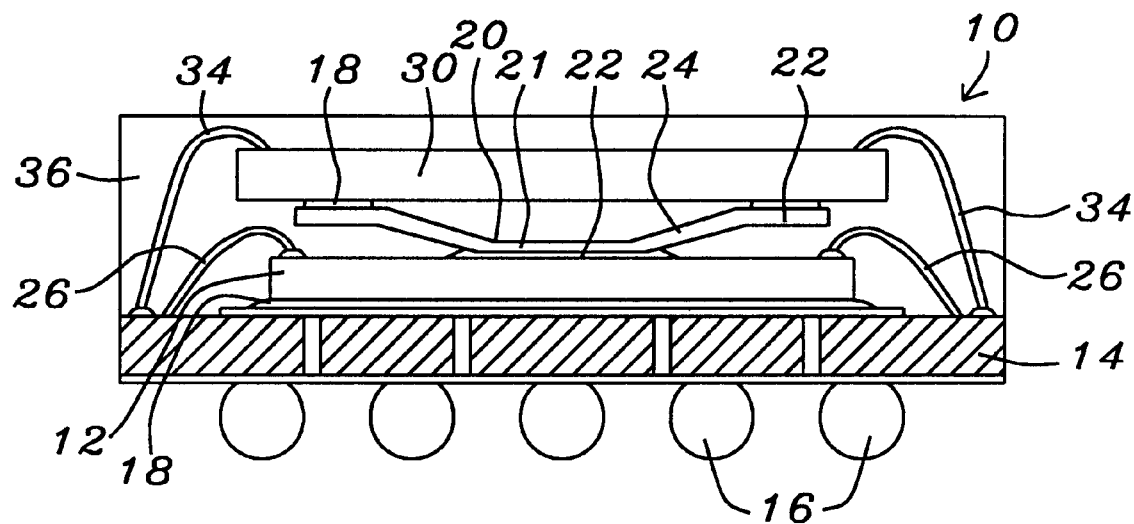
FIGS. 1 and 2 schematically illustrate a first preferred electrically isolated metal interposer embodiment of the present invention with FIG. 1 being a cross-sectional view of the overhead plan view FIG. 2 taken along line 1—1.
Figure 2:
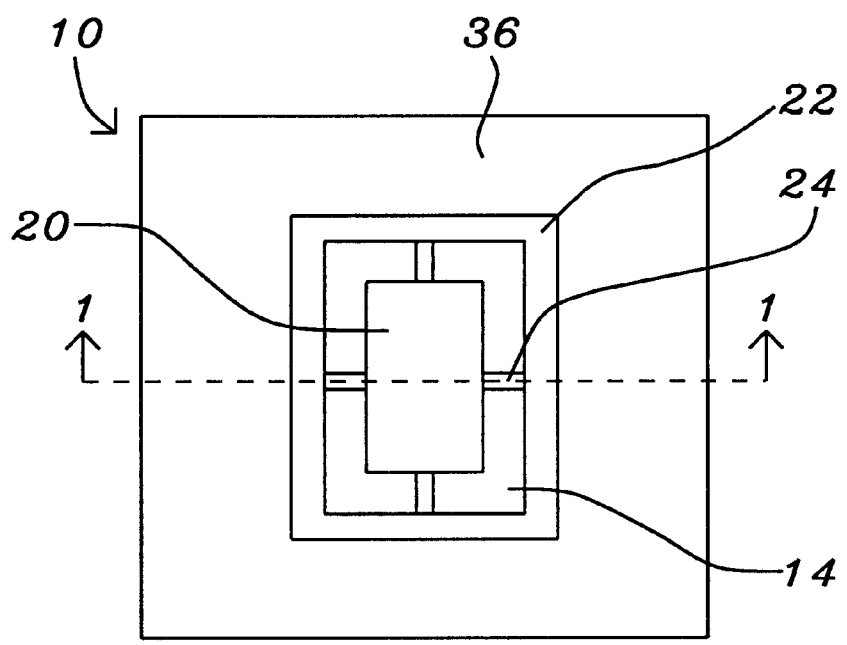

First Embodiment—Electrically isolated Metal Interposer 20; FIGS. 1 and 2

As shown in FIGS. 1 and 2, the first embodiment of the present invention illustrates a package 10 having a electrically isolated metal interposer stacked die/chip design with no ground.

Lower die/chip 12 is attached to a substrate 14 preferably using an adhesive material 18. Substrate 14 may include solder balls or metallized lands 16 for interconnection to the system level printed circuit board (not shown) affixed to the lower surface of substrate 14 as shown in FIG. 1. Solder balls 16 are preferably comprised of a eutectic tin-lead solder alloy, tin, lead, silver, gold, indium and more preferably a eutectic tin-lead solder alloy.

The substrate 14 is preferably an epoxy-glass laminate, a polyimide tape, a ceramic, a copper alloy leadframe or an aluminum alloy leadframe.

Adhesive material 18 is preferably comprised of a thermally conductive organic/ inorganic filler.

Lower die/chip wires 26 may then be attached to the upper surface of lower die/chip 12 and to the upper surface of the substrate 14 as shown in FIG. 1.

Metal interposer 20 is then attached to the substantial center of lower die/chip 12 using adhesive material 18. Metal interposer 20 is generally a solid, thermally conductive structure including a ring-shaped outer ring die pad 22 connected to the center 21 of metal interposer 20 by tie bars/internal support columns 24. Internal support columns/tie bars 24 are used to connect the center die pad 21 to the ring-shaped outer die pad 22.

Metal interposer 20 is preferably comprised of a copper alloy, an aluminum alloy or an iron alloy and is more preferably comprised of a copper alloy. Metal interposer 20 is electrically conductive.

Upper die/chip 30 is then substantially centered over, and attached to, the upper surface of the ring-shaped outer ring die pad 22 using adhesive material 18.

Upper die/chip wires 34 may then be attached to the upper surface of upper die/chip 30 and to the upper surface of the substrate 14 as shown in FIG. 1.

It is noted that the metal interposer 20 is a thermal conductor, permitting heat from the upper die/chip 30 to be taken away from the upper die/chip 30 and through the lower die/chip 12 into the substrate 14 and away from package 10 through the solder balls or metallized lands 16.

An encapsulate/molding material 36 is then formed around the upper die/chip 30, the upper and lower die/chip wires 26, 34 and over the lower die/chip 12 and the substrate 14 as shown in FIG. 1.

Alternately, the lower and upper die/chip wires 26, 34 may be attached to the respective lower and upper dies/chips 12, 30 after the lower and upper dies/chips 12, 30 are affixed to the metal interposer 20. The wires 26, 34 may be attached in one pass (equipment set-up) if the upper die 30 is small along its length and/or width and does not interfere with the wire connection of the lower die 12 to the substrate 14 wiring process.

FIG. 2 is a top-down, plan view of FIG. 1 (with upper and lower die/chips 12, 30 not shown) with FIG. 1 being a cross-section of FIG. 2 along line 1—1 (with upper and lower die/chips 12, 30 shown). FIG. 2 illustrates package 10 having the center 21 of metal interposer 20 connected to its ring-shaped outer ring die pad 22 through tie bars 24. Encapsulant 36 envelopes the metal interposer 20 (and upper and lower die/chips 12, 30 (not shown)).

It is noted that while the tie bars 24 of metal interposer 20 are illustrated in FIG. 2 in a "+" design, other essentially symmetrical designs of tie bars 24 are possible such as, for example, an "X" design.

It is noted that the first embodiment electrically isolated metal interposer package 10 has no ground.

Second Embodiment—Electrically Grounded Metal Interposer 120; FIGS. 3 to 6

Figure 3:
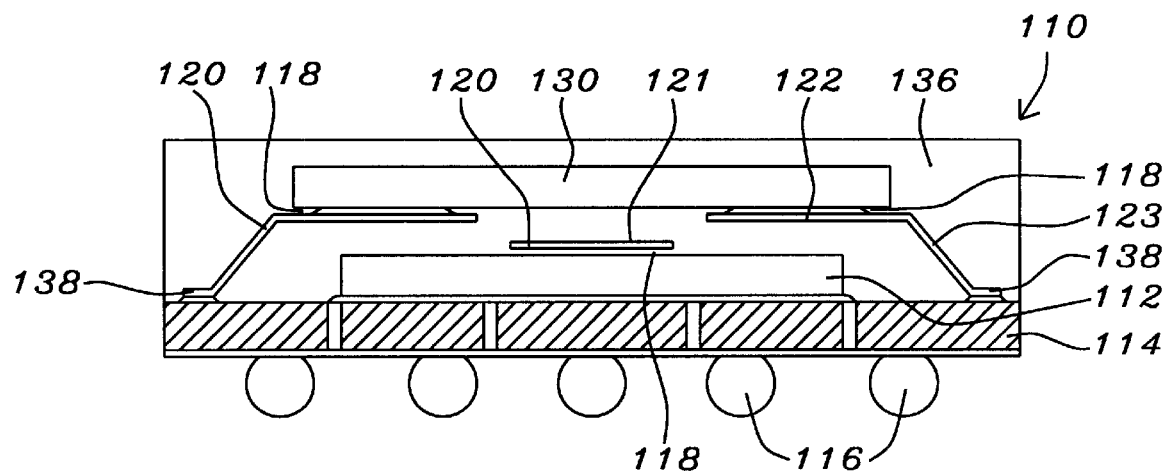
FIGS. 3 and 4 schematically illustrate a second preferred electrically grounded metal interposer embodiment of the present invention with FIG. 3 being a cross-sectional view of the top down plan view FIG. 4 taken along line 3—3.
Figure 4:
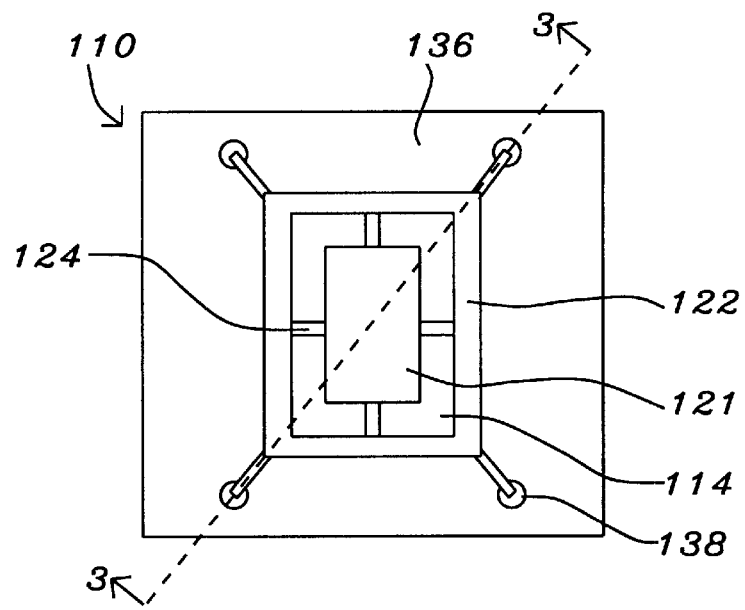
Figure 5:
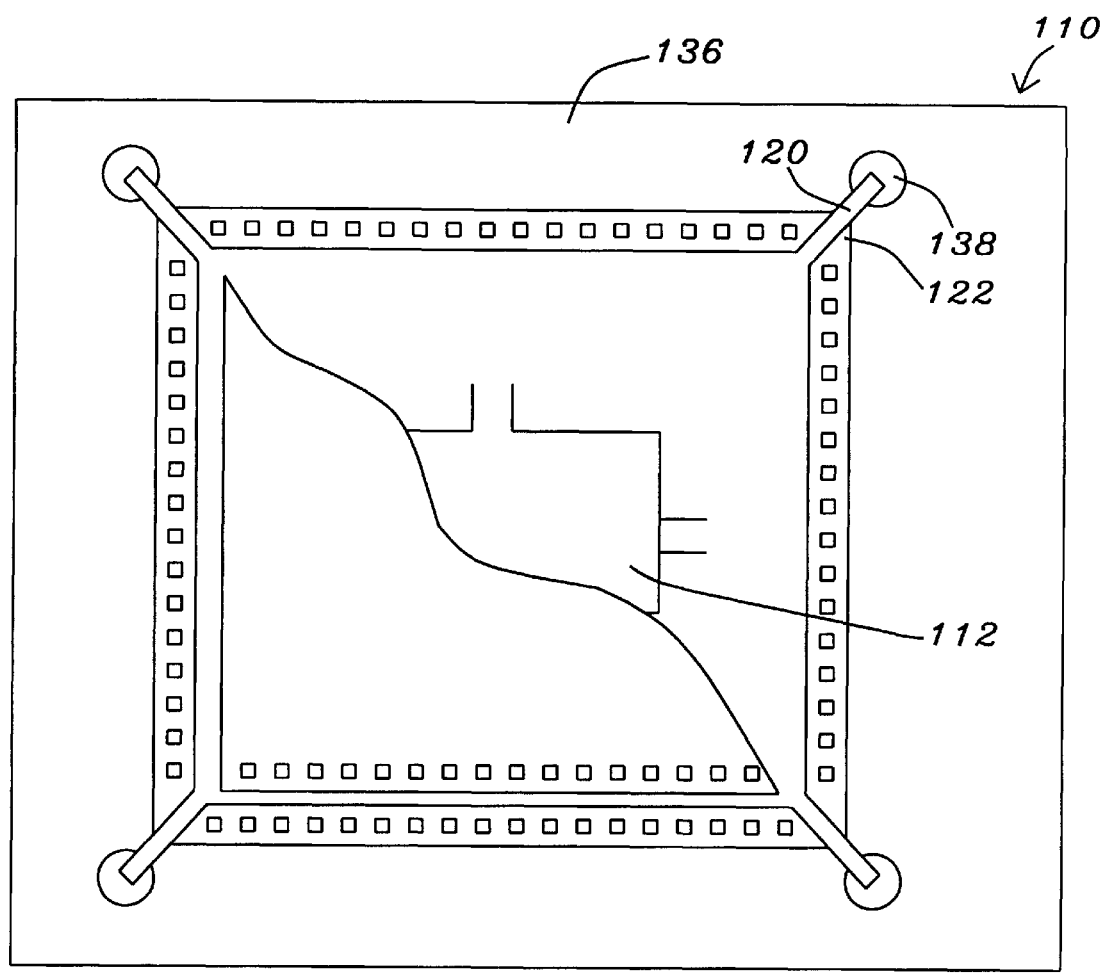
FIG. 5 schematically illustrates a top down plan view of the second preferred electrically grounded metal interposer embodiment of the present invention after the die attachment (D/A) process.

As shown in FIGS. 3 to 5, the second embodiment of the present invention illustrates a package 110 having a electrically grounded metal interposer with support column stacked die/chip design.

Lower die/chip 112 is attached to a substrate 114 preferably using an adhesive material 118. Substrate 114 may include solder balls or metallized lands 116 for interconnection to the system level printed circuit board (not shown) affixed to the lower surface of substrate 114 as shown in FIG. 3. Solder balls 116 are preferably comprised of a eutectic tin-lead solder alloy, tin, lead, silver, gold, indium and more preferably a eutectic tin-lead solder alloy.

The substrate 114 is preferably an epoxy-glass laminate, a polyimide tape, a ceramic, a copper alloy leadframe or an aluminum alloy leadframe.

Adhesive material 118 is preferably comprised of a thermally conductive organic/inorganic filler.

Lower die wires (not shown) may then be attached to the upper surface of lower die/chip 112 and to the upper surface of the substrate 114. The wires (not shown) may be attached in one pass (equipment set-up) if the upper die 130 is small along its length and/or width and does not interfere with the wire connection of the lower die 112 to the substrate 114 wiring process.

Metal interposer 120 is then attached to the substantial center of lower die/chip 112 using adhesive material 118. Metal interposer 120 is a thermally conductive structure including outer portions 122 and a center portion 121 that is connected to the substantial center of lower die/chip 112. The outer portions 122 of metal interposer 120 are electrically grounded to substrate 114 as at 138 through leg portions/external support columns 123. External support columns 123 are used to support the ring-shaped outer die pad 122 connecting to underlying substrate 114 in place.

Metal interposer 120 is preferably comprised of a copper alloy, an aluminum alloy or an iron alloy and is more preferably a copper alloy. Metal interposer 120 is electrically conductive.

Upper die/chip 130 is then substantially centered over, and attached to, the upper surfaces of the outer portions 122 of metal interposer 120 using adhesive material 118.

It is noted that the metal interposer 120 is a thermal conductor, permitting heat from the upper die/chip 130 to be taken away from the upper die/chip 130 and through the lower die/chip 112 into the substrate 114 and away from package 110 through the solder balls or metallized lands 116. Heat also flows from the upper die 130 to the substrate 114 through the legs 123 of the metal interposer 120.

Upper die/chip wires (not shown) may then be attached to the upper surface of upper die/chip 130 and to the upper surface of the substrate 114. The wires (not shown) may be attached in one pass (equipment set-up) if the upper die 130 is small along its length and/or width and does not interfere with the wire connection of the lower die 112 to the substrate 114 wiring process.

An encapsulate/molding material 136 is then formed around the upper die/chip 130, the upper and lower die/chip wires and over the lower die/chip 112 and the substrate 114 as shown in FIG. 3.

Alternately, the lower and upper die/chip wires may be attached to the respective lower and upper dies/chips 112, 130 after the lower and upper dies/chips 112,130 are affixed to the metal interposer 120. If the upper die/chip 130 has bond pads on only two opposite sides, more support columns could be added, with the limit to the number added being encapsulate/mold 136 flow.

FIG. 4 is a top-down, plan view of FIG. 3 with FIG. 3 being a cross-section of FIG. 2 along line 3—3. FIG. 4 illustrates package 110 having the center and outer portions 121, 122 of metal interposer 120. Encapsulant 136 envelopes the metal interposer 120 (and upper and lower die/chips 112, 130 (not shown)).

FIG. 5 is a top down, plan view of FIG. 3 after die attachment.

Figure 7:
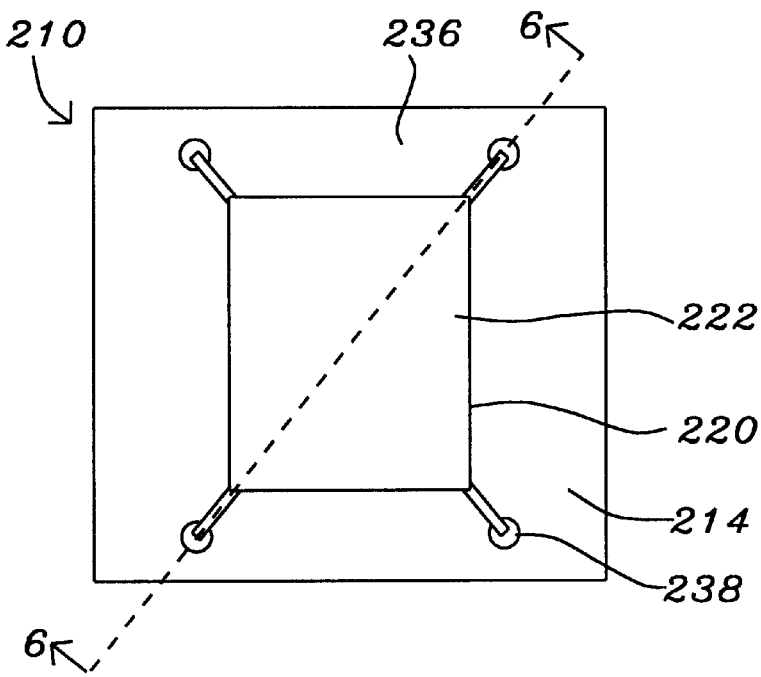
Figure 8:
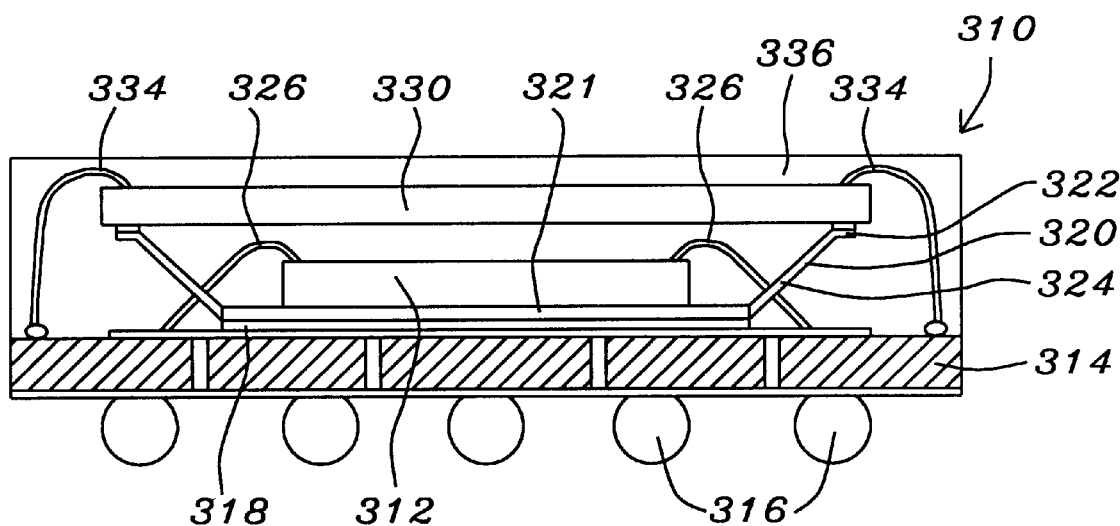

Third Embodiment—Electrically Grounded Metal Interposer 220; FIGS. 7 and 8

As shown in FIGS. 7 and 8, the third embodiment of the present invention illustrates a package 210 having a electrically grounded metal interposer with support columns stacked die/chip design.

Figure 6:
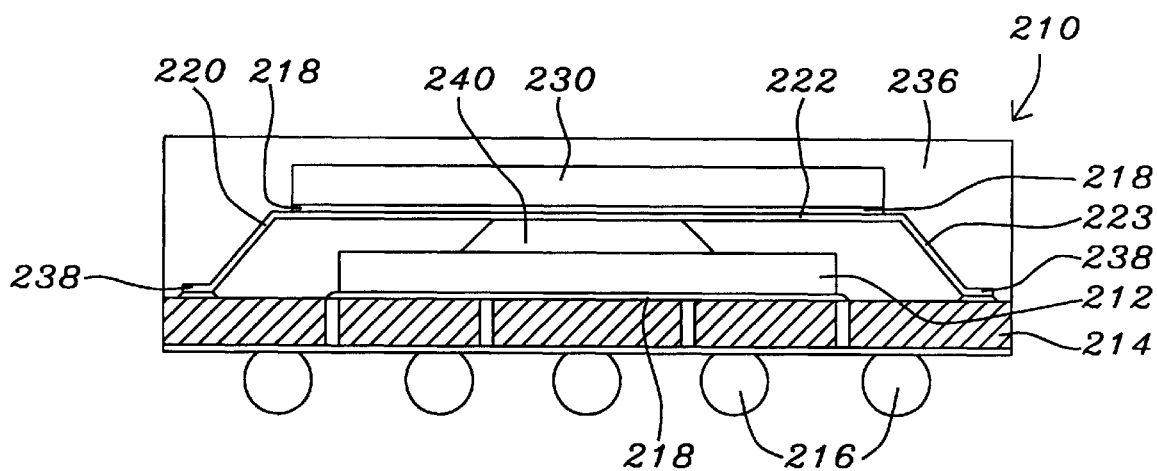
FIGS. 6 and 7 schematically illustrate a third preferred electrically grounded metal interposer with support columns embodiment of the present invention having a metal interposer above the lower die/chip, with FIG. 6 being a cross-sectional view of the top down plan view FIG. 7 taken along line 6—6.

Lower die/chip 212 is attached to a substrate 214 preferably using an adhesive material 218. Substrate 214 may include solder balls or metallized lands 216 for interconnection to the system level printed circuit board (not shown) affixed to the lower surface of substrate 214 as shown in FIG. 6. Solder balls 216 are preferably comprised of a eutectic tin-lead solder alloy, tin, lead, silver, gold, indium and more preferably a eutectic tin-lead solder alloy.

The substrate 214 is preferably an epoxy-glass laminate, a polyimide tape, a ceramic, a copper alloy leadframe or an aluminum alloy leadframe.

Adhesive material 218 is preferably comprised of a thermally conductive organic/ inorganic filler.

Lower die wires (not shown) may then be attached to the upper surface of lower die/chip 212 and to the upper surface of the substrate 214.

Metal interposer 220 is then substantially centered over the lower die/chip 212 and the upper portion 222 of metal interposer 220 is attached, and electrically grounded, to substrate 214 through leg portions/external support columns 223 as at 238 using adhesive material 218. External support columns 223 are used to support the ring-shaped outer die pad 222 connecting to underlying substrate 214 in place. Metal interposer 220 is a thermally conductive structure.

Metal interposer 220 is preferably comprised of a copper alloy, an aluminum alloy or an iron alloy and is more preferably a copper alloy. Metal interposer 20 is electrically conductive.

Optionally, a thermal glue 240 may be interposed between the upper portion 222 of metal interposer 220 and the upper surface of lower die/chip 212 as shown in FIG. 6. The thermal glue 240 is thermally conductive and permits transfer of heat from the upper die 230 to the lower die 212 or from the lower die 212 to the upper die 230 depending upon the temperature difference.

Upper die/chip 230 is then substantially centered over, and attached to, the upper surfaces of the upper portion 222 of metal interposer 220 using adhesive material 218.

It is noted that the metal interposer 220 is a thermal conductor, permitting heat from the upper die/chip 230 to be taken away from the upper die/chip 230 and into the substrate 214 and away from package 210 through the solder balls or metallized lands 216. Heat also flows from the upper die 230 to the substrate 214 through the legs 223 of the metal interposer 220.

Upper die/chip wires (not shown) may then be attached to the upper surface of upper die/chip 230 and to the upper surface of the substrate 214.

An encapsulate/molding material 236 is then formed around the upper die/chip 230, the upper and lower die/chip wires and over the lower die/chip 212 and the substrate 214 as shown in FIG. 6.

Alternately, the lower and upper die/chip wires may be attached to the respective lower and upper dies/chips 212, 230 after the lower and upper dies/chips 212, 230 are affixed to the metal interposer 220. The wires may be attached in one pass (equipment set-up) if the upper die 230 is small along its length and/or width and does not interfere with the wire connection of the lower die 212 to the substrate 214 wiring process. If the upper die/chip 230 has bond pads on only two opposite sides, more support columns could be added, with the limit to the number added being encapsulate/mold 236 flow.

FIG. 7 is a top-down, plan view of FIG. 6, with FIG. 6 being a cross-section of FIG. 7 along line 6—6. FIG. 7 illustrates package 210 having metal interposer 220 electrically grounded to substrate 214 through leg portions/external support columns 223 as at 238. Encapsulant 236 envelopes the metal interposer 220 (and upper and lower die/chips 212, 230 (not shown)).

Figure 9:
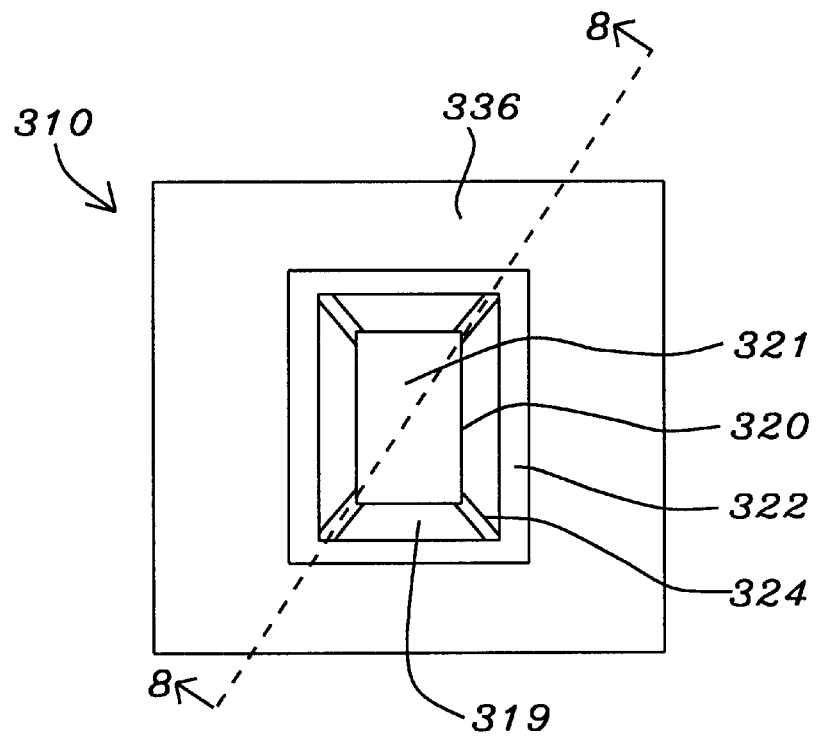
Figure 10:
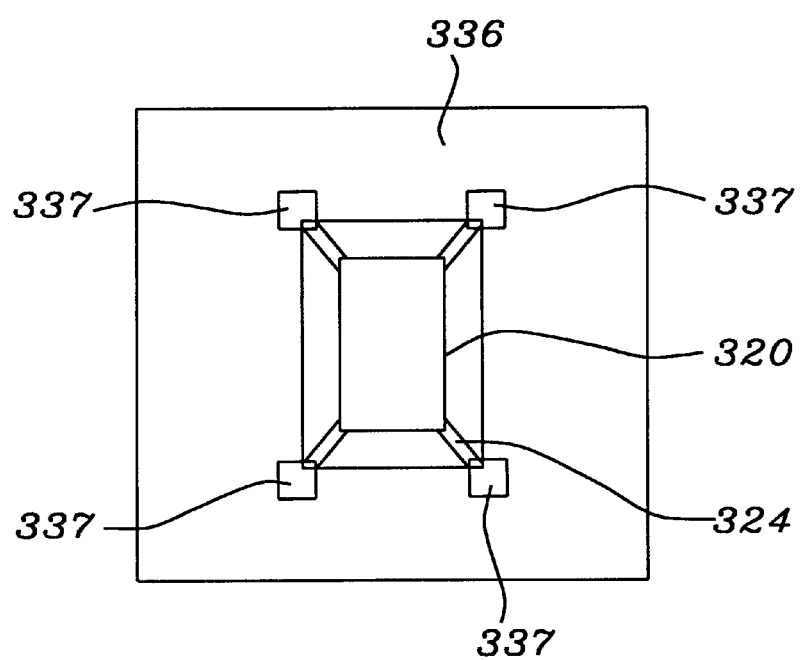
FIG. 10 is top down plan view of a modification of the fourth embodiment wherein the upper portion of the metal interposer comprises four discrete pads the end of each support column.

Fourth Embodiment—Electrically Grounded Metal Interposer 320; FIGS. 9 to 11

As shown in FIGS. 9 to 11, the fourth embodiment of the present invention illustrates a package 310 having another electrically grounded metal interposer with support columns stacked die/chip design.

In the fourth embodiment, metal interposer 320 is affixed, and electrically grounded, to the substantial center of substrate 314 at its lower center portion 321 preferably using adhesive material 318. Metal interposer 320 is a thermally conductive structure and further includes upper portion 322 connected to the lower center portion 321 through leg portions/external support columns 324.

The substrate 314 is preferably an epoxy-glass laminate, a polyimide tape, a ceramic, a copper alloy leadframe or an aluminum alloy leadframe.

Metal interposer 320 is preferably comprised of a copper alloy, an aluminum alloy or an iron alloy and is more preferably a copper alloy. Metal interposer 20 is electrically conductive.

Adhesive material 318 is preferably comprised of a thermally conductive organic/inorganic filler.

Substrate 314 may include solder balls or metallized lands 316 for interconnection to the system level printed circuit board (not shown) affixed to the lower surface of substrate 314 as shown in FIG. 8. Solder balls 316 are preferably comprised of a eutectic tin-lead solder alloy, tin, lead, silver, gold, indium and more preferably a eutectic tin-lead solder alloy.

Lower die/chip 312 is then substantially centered, and attached to, the lower center portion of metal interposer 320 preferably using adhesive material 318.

Lower die wires 326 may then be attached to the upper surface of lower die/chip 312 and to the upper surface of the substrate 314.

Upper die/chip 330 is then substantially centered over, and attached to, the upper surfaces of the upper portion 322 of metal interposer 320 preferably using adhesive material 318.

It is noted that the metal interposer 320 is a thermal conductor, permitting heat from the upper die/chip 330 to be taken away from the upper die/chip 330 and into the substrate 314 and away from package 310 via the leg portions/external support columns 324 through the solder balls or metallized lands 316. Any heat from the lower die/chip 312 may be likewise taken away from the lower die/chip 312 and into the substrate 314 and away from package 310 through the solder balls or metallized lands 316.

Upper die/chip wires 334 may then be attached to the upper surface of upper die/chip 330 and to the upper surface of the substrate 314.

An encapsulate/molding material 336 is then formed around the upper die/chip 330, the upper and lower die/chip wires 334, 326 and over the lower die/chip 312 and the substrate 314 as shown in FIG. 8.

Alternately, the upper and lower die/chip wires 334, 326 may be attached to the respective upper and lower dies/chips 332, 312 after the upper and lower dies/chips 330, 312 are affixed to the metal interposer 320.

If the upper die/chip 330 has bond pads on only two opposite sides, more support columns could be added, with the limit to the number added being encapsulate/mold 336 flow.

FIG. 9 is a top-down, plan view of FIG. 8, with FIG. 8 being a cross-section of FIG. 9 along line 8—8. FIG. 9 illustrates package 310 having metal interposer 320 electrically grounded to substrate 214 through leg portions/external support columns 223 as at 238. Encapsulant 236 envelopes the metal interposer 220 (and upper and lower die/chips 212, 230 (not shown)).

FIG. 10 is top down plan view of a modification of the fourth embodiment wherein the upper portion of the metal interposer 320 comprises four discrete pads 337 the end of each leg portion/support column 324.

It is noted that the stacked die/chip package designs of the embodiments of the present invention have reduced die attach interface area to reduce stress and moisture sensitivity.

Advantages of the Present Invention

The advantages of one or more embodiments of the present invention include:
1. lower mechanical stress for the upper die/chip attachment, especially at the metal interposer to the upper die attachment interface at the die attach area is reduced due to "ring" shape;
2. lower metal interposer to substrate attachment stress as the metal interposer is more preferably comprised of a copper alloy which closely matches in CTE with laminate substrates;
3. optional additional heat removal from the upper or lower die/chip is provided which is very useful in die/chip combinations where the upper die also generates heat;
4. additional support columns may be added as necessary with the limit of support columns being added limited by the encapsulate/mold flow; and
5. upper die/chip grounding is made possible, such upper die/chip grounding also isolates the upper die/chip from the lower die/chip in high frequency operation such as switching noise or interference.

While particular embodiments of the present invention have been illustrated and described, it is not intended to limit the invention, except as defined by the following claims.

We claim:

1. A stacked die design, comprising:
    a substrate having a lower surface and an upper surface;
    a lower die connected to the substrate; the lower die having a lower surface and an upper surface;
    a thermally conductive metal interposer thermally connected to the substrate; and
    an upper die thermally connected to the metal interposer; the upper die having a lower surface and an upper surface; the lower die and the upper die being spaced apart and comprising a stacked die;
    whereby any heat generated by the upper die is transferred to the substrate by the metal interposer.

2. The stacked die design of claim 1, wherein the substrate is an epoxy-glass laminate, a polyimide tape, a ceramic, a copper alloy leadframe or an aluminum alloy leadframe.

3. The stacked die design of claim 1, further including solder balls or metallized lands affixed to the lower surface of the substrate; whereby any heat transferred to the substrate is transferred to the solder balls or metallized lands.

4. The stacked die design of claim 1, further including solder balls or metallized lands affixed to the lower surface of the substrate; the solder balls being comprised of a eutectic tin-lead solder alloy, tin, lead, silver, gold, or indium.

5. The stacked die design of claim 1, further including solder balls or metallized lands affixed to the lower surface of the substrate; the solder balls being comprised of a copper alloy.

6. The stacked die design of claim 1, wherein the metal interposer is comprised of a copper alloy, an aluminum alloy or an iron alloy.

7. The stacked die design of claim 1, wherein the metal interposer is comprised of a copper alloy.

8. The stacked die design of claim 1, wherein the metal interposer is interposed between the lower die and the upper die.

9. The stacked die design of claim 1, wherein the metal interposer is interposed between the lower die and the upper die; and the metal interposer being affixed to the upper surface of the lower die and to the lower surface of the upper die.

10. The stacked die design of claim 1, wherein the metal interposer/stacked die is not electrically grounded.

11. The stacked die design of claim 1, wherein the metal interposer is connected to: the upper surface of the substrate; the lower surface of the upper die; and the upper surface of the lower die.

12. The stacked die design of claim 1, wherein the metal interposer is connected to: the upper surface of the substrate; the lower surface of the upper die; and the upper surface of the lower die; whereby the metal interposer is electrically connected to the substrate to ground at least the upper die.

13. The stacked die design of claim 1, wherein the metal interposer is a double down-set metal interposer.

14. The stacked die design of claim 1, wherein the metal interposer is connected to: the upper surface of the substrate; and the lower surface of the upper die.

15. The stacked die design of claim 1, wherein the metal interposer is connected to: the upper surface of the substrate; and the lower surface of the upper die; whereby the metal interposer is electrically connected to the substrate to ground at least the upper die.

16. The stacked die design of claim 1, wherein a thermal glue is interposed between the lower die and the upper die.

17. The stacked die design of claim 1, wherein a thermal glue is interposed between the lower die and the upper die; the thermal glue being thermally conductive and permitting transfer of any heat generated between the upper die and the lower die.

18. The stacked die design of claim 1, wherein the metal interposer is connected to: the upper surface of the substrate; the lower surface of the lower die; and the lower surface of the upper die.

19. The stacked die design of claim 1, wherein the metal interposer is connected to: the upper surface of the substrate; the lower surface of the lower die; and the lower surface of the upper die; whereby the metal interposer is electrically grounded to the substrate to ground the lower and upper dies.

20. A stacked die design, comprising:
    a substrate having a lower surface and an upper surface;
    a lower die connected to the substrate; the lower die having a lower surface and an upper surface;
    a thermally conductive metal interposer thermally connected to the substrate; the metal interposer being comprised of a copper alloy, an aluminum alloy or an iron alloy; and
    an upper die thermally connected to the metal interposer; the upper die having a lower surface and an upper surface; the lower die and the upper die being spaced apart and comprising a stacked die;
    whereby any heat generated by the upper die is transferred to the substrate by the metal interposer.

21. The stacked die design of claim 20, wherein the substrate is an epoxy-glass laminate, a polyimide tape, a ceramic, a copper alloy leadframe or an aluminum alloy leadframe.

22. The stacked die design of claim 20, further including solder balls or metallized lands affixed to the lower surface of the substrate; whereby any heat transferred to the substrate is transferred to the solder balls or metallized lands.

23. The stacked die design of claim 20, further including solder balls or metallized lands affixed to the lower surface of the substrate; the solder balls being comprised of a eutectic tin-lead solder alloy, tin, lead, silver, gold, or indium.

24. The stacked die design of claim 20, further including solder balls or metallized lands affixed to the lower surface of the substrate; the solder balls being comprised of a copper alloy.

25. The stacked die design of claim 20, wherein the metal interposer is comprised of a copper alloy.

26. The stacked die design of claim 20, wherein the metal interposer is interposed between the lower die and the upper die.

27. The stacked die design of claim 20, wherein the metal interposer is interposed between the lower die and the upper die; and the metal interposer being affixed to the upper surface of the lower die and to the lower surface of the upper die.

28. The stacked die design of claim 20, wherein the metal interposer/stacked die is not electrically grounded.

29. The stacked die design of claim 20, wherein the metal interposer is connected to: the upper surface of the substrate; the lower surface of the upper die; and the upper surface of the lower die.

30. The stacked die design of claim 20, wherein the metal interposer is connected to: the upper surface of the substrate; the lower surface of the upper die; and the upper surface of the lower die; whereby the metal interposer is electrically connected to the substrate to ground at least the upper die.

31. The stacked die design of claim 20, wherein the metal interposer is a double down-set metal interposer.

32. The stacked die design of claim 20, wherein the metal interposer is connected to: the upper surface of the substrate; and the lower surface of the upper die.

33. The stacked die design of claim 20, wherein the metal interposer is connected to: the upper surface of the substrate; and the lower surface of the upper die; whereby the metal interposer is electrically connected to the substrate to ground at least the upper die.

34. The stacked die design of claim 20, wherein a thermal glue is interposed between the lower die and the upper die.

35. The stacked die design of claim 20, wherein a thermal glue is interposed between the lower die and the upper die; the thermal glue being thermally conductive and permitting transfer of any heat generated between the upper die and the lower die.

36. The stacked die design of claim 20, wherein the metal interposer is connected to: the upper surface of the substrate; the lower surface of the lower die; and the lower surface of the upper die.

37. The stacked die design of claim 20, wherein the metal interposer is connected to: the upper surface of the substrate; the lower surface of the lower die; and the lower surface of the upper die; whereby the metal interposer is electrically grounded to the substrate to ground the lower and upper dies.

38. A method of forming a stacked die design, comprising:
   providing a substrate having a lower surface and an upper surface;
   providing a lower die connected to the substrate; the lower die having a lower surface and an upper surface;
   providing a thermally conductive metal interposer thermally connected to the substrate; and
   providing an upper die thermally connected to the metal interposer; the upper die having a lower surface and an upper surface; the lower die and the upper die being spaced apart and comprising a stacked die;
   whereby any heat generated by the upper die is transferred to the substrate by the metal interposer.

39. The method of claim 38, wherein the substrate is an epoxy-glass laminate, a polyimide tape, a ceramic, a copper alloy leadframe or an aluminum alloy leadframe.

40. The method of claim 38, further including affixing solder balls or metallized lands affixed to the lower surface of the substrate; whereby any heat transferred to the substrate is transferred to the solder balls or metallized lands.

41. The method of claim 38, further including affixing solder balls or metallized lands affixed to the lower surface of the substrate; the solder balls being comprised of a eutectic tin-lead solder alloy, tin, lead, silver, gold, or indium.

42. The method of claim 38, further including affixing solder balls or metallized lands affixed to the lower surface of the substrate; the solder balls being comprised of a copper alloy.

43. The method of claim 38, wherein the metal interposer is comprised of a copper alloy, an aluminum alloy or an iron alloy.

44. The method of claim 38, wherein the metal interposer is comprised of a copper alloy.

45. The method of claim 38, wherein the metal interposer is interposed between the lower die and the upper die.

46. The method of claim 38, wherein the metal interposer is interposed between the lower die and the upper die; and the metal interposer being affixed to the upper surface of the lower die and to the lower surface of the upper die.

47. The method of claim 38, wherein the metal interposer/stacked die is not electrically grounded.

48. The method of claim 38, wherein the metal interposer is connected to: the upper surface of the substrate; the lower surface of the upper die; and the upper surface of the lower die.

49. The method of claim 38, wherein the metal interposer is connected to: the upper surface of the substrate; the lower surface of the upper die; and the upper surface of the lower die; whereby the metal interposer is electrically connected to the substrate to ground at least the upper die.

50. The method of claim 38, wherein the metal interposer is a double down-set metal interposer.

51. The method of claim 38, wherein the metal interposer is connected to: the upper surface of the substrate; and the lower surface of the upper die.

52. The method of claim 38, wherein the metal interposer is connected to: the upper surface of the substrate; and the lower surface of the upper die; whereby the metal interposer is electrically connected to the substrate to ground at least the upper die.

53. The method of claim 38, wherein a thermal glue is interposed between the lower die and the upper die.

54. The method of claim 38, wherein a thermal glue is interposed between the lower die and the upper die; the thermal glue being thermally conductive and permitting transfer of any heat generated between the upper die and the lower die.

55. The method of claim 38, wherein the metal interposer is connected to: the upper surface of the substrate; the lower surface of the lower die; and the lower surface of the upper die.

56. The method of claim 38, wherein the metal interposer is connected to: the upper surface of the substrate; the lower surface of the lower die; and the lower surface of the upper die; whereby the metal interposer is electrically grounded to the substrate to ground the lower and upper dies.

* * * * *